(12) United States Patent
Duerk et al.

(10) Patent No.: US 6,404,198 B1
(45) Date of Patent: Jun. 11, 2002

(54) MAGNETIC RESONANCE IMAGING (MRI) OPTIMIZED CHEMICAL-SHIFT EXCITATION

(75) Inventors: Jeffrey L. Duerk, Avon Lake; Michael Wendt, Cleveland; Jonathan S. Lewin, Beachwood; Dee H. Wu, Shaker Heights, all of OH (US)

(73) Assignee: Case Western Reserve University, Cleveland, OH (US)

( * ) Notice: Subject to any disclaimer, the term of this patent is extended or adjusted under 35 U.S.C. 154(b) by 0 days.

(21) Appl. No.: 09/509,325

(22) PCT Filed: Sep. 25, 1998

(86) PCT No.: PCT/US98/20100
§ 371 (c)(1),
(2), (4) Date: Nov. 6, 2000

(87) PCT Pub. No.: WO99/15915
PCT Pub. Date: Apr. 1, 1999

Related U.S. Application Data

(60) Provisional application No. 60/060,184, filed on Sep. 26, 1997.

(51) Int. Cl.[7] .................................................. G01V 3/00
(52) U.S. Cl. ....................................... 324/314; 324/300
(58) Field of Search ................................ 324/314, 300, 324/307, 309, 312, 318

(56) References Cited

U.S. PATENT DOCUMENTS 5,285,159 A * 2/1994 Bodenhausen et al. ...... 324/307
5,296,809 A * 3/1994 Roberts et al. ............. 324/309

* cited by examiner

*Primary Examiner*—Louis Arana
(74) *Attorney, Agent, or Firm*—Fay, Sharpe, Fagan, Minnich & McKee, LLP

(57) ABSTRACT

A magnetic resonance imaging (MRI) system (100) performs optimized chemical-shift excitation. A computer system (110) performs a constrained numerical optimization to determine radio frequency (RF) pulse amplitudes, phase angles, and interpulse intervals for a binomial-like RF pulse sequence that will excite magnetization (41) of a selective one of two chemical species, such as water and fat for example, of a subject (102) in relatively less time and that may therefore be used at lower magnetic fields. A static magnet (132) produces a magnetic field along a predetermined axis relative to the subject Pulse sequence apparatus (134, 152, 154, 156, 158) creates magnetic field gradients with the magnetic field, applies RF pulsed magnetic fields, and receives resulting RF magnetic resonance (MR) signals. Pulse sequence control apparatus (142) controls the pulse sequence apparatus to apply the binomial-like RF pulse sequence to the subject. The computer system reconstructs an image from received RF MR signals resulting from application of the binomial-like RF pulse sequence.

31 Claims, 4 Drawing Sheets

MAGNETIC RESONANCE IMAGING (MRI) OPTIMIZED CHEMICAL-SHIFT EXCITATION

This patent application claims the benefit of the Sep. 26, 1997 filing date of U.S. Provisional Application No. 60/060,184, which is herein incorporated by reference.

FIELD OF THE INVENTION

The present invention relates generally to the field of magnetic resonance imaging (MRI). More particularly, the present invention relates to the field of MRI chemical-shift excitation.

BACKGROUND OF THE INVENTION

In a typical magnetic resonance imaging MRI) system, a subject such as a human body is placed in a static magnetic field such that selected nuclear magnetic dipoles of the subject preferentially align with the magnetic field. The MRI system then applies radio frequency (RF) pulsed magnetic fields to cause magnetic resonance of the preferentially aligned dipoles and detects RF magnetic resonance (MR) signals from the resonating dipoles for reconstruction into an image representation. The MRI system typically scans the region to be imaged by applying RF pulse sequences to the subject while imposing time-varying magnetic field gradients with the static magnetic field.

In imaging most tissues with MRI, the hydrogen protons from water are preferably detected as most soft tissues are composed of greater than approximately eighty percent water. Unfortunately, fat is also largely composed of hydrogen protons and may therefore appear as an unwanted or unnecessary component in many hydrogen MR images. A variety of methods have been developed to help eliminate the effect of fat magnetization from hydrogen MR images and thereby improve the contrast between normal and pathologic tissue in a variety of anatomic locations such as, for example, the liver and pancreas, the orbits, the breast, bone marrow, and the coronary arteries. Water excitation methods apply an RF pulse sequence to tip water magnetization and not fat magnetization for detection. Fat suppression methods apply an RF pulse sequence to tip fat magnetization and not water magnetization, eliminate the fat magnetization, and then excite the water magnetization for detection. Such methods are able to tip water and fat magnetization in a selective manner because of the chemical shift difference in resonant frequency between water protons and protons in the methylene (—$CH_2$) groups of fat molecules.

The chemical shift difference between two chemical species in which excitation of one and elimination of the other is desired is given by $\delta$ in parts per million (ppm). For water and fat protons, the chemical shift difference is approximately 3.5 ppm in accordance with the following equations:

$$\omega_{water} = \gamma B_0 = \sim 2\pi(64.05 \text{ megaHertz (MHz)}) \quad \text{at } B_0 = \sim 1.5 \text{ Tesla or}$$

$$= \sim 2\pi(8.5 \text{ MHz}) \quad \text{at } B_0 = \sim 0.2 \text{ Tesla}$$

$$\Delta\omega_{water-fat} = \sim 2\pi(64.05 \text{ MHz})\delta = \sim 2\pi(224 \text{ Hz}) \quad \text{at } B_0 = \sim 1.5 \text{ Tesla or}$$

$$= \sim 2\pi(8.5 \text{ MHz})\delta = \sim 2\pi(29.75 \text{ Hz}) \quad \text{at } B_0 = \sim 0.2 \text{ Tesla}$$

where $\omega$ is the Larmor frequency of the nuclei of interest, $\gamma$ is the gyromagnetic ratio of the nuclei of interest, and $B_0$ is the applied static magnetic field.

One common fat suppression method applies binomial sets of RF pulses at specific amplitudes and specific interpulse intervals to tip fat magnetization into the transverse or detection plane while restoring water magnetization to the longitudinal axis. The amplitudes of the RF pulses are set such that their sum is approximately zero when observed by a water molecule (i.e., on resonance), and the duration of each interpulse interval is set, for example, to $\pi/\Delta\omega = \sim 1/(448 \text{ Hz})$ at $B_0 = 1.5$ Tesla $= \sim 2.2$ milliseconds (ms) such that the water and fat protons precess by approximately 180° or $\pi$ radians with respect to one another. Once in the detection plane, the fat magnetization may be spoiled or destroyed. A selective RF pulse may then be applied to tip the remaining longitudinal magnetization into the detection plane. As the time interval between the tipping of fat magnetization into the detection plane and spoiling is relatively short, the remaining longitudinal magnetization tipped by the selective RF pulse is substantially all water magnetization. Exemplary prior art binomial RF pulse sequences include 1-(-1), 1-(-2)-1, and 1-(-3)-3-(-1) sequences.

The application of a prior art binomial 1-(-1) RF pulse sequence for fat suppression is illustrated in graph form in FIGS. 1A, 1B, 1C, 1D, and 1E. As illustrated in FIG. 1A, water magnetization 11 and fat magnetization 12 are initially aligned with the static magnetic field $B_0$ along the z-axis at equilibrium. A first RF pulse in the 1-(-1) sequence tips both water magnetization 11 and fat magnetization 12 by approximately 45° as illustrated in FIG. 1B. During an interpulse interval of approximately 2.2 ms for $B_0 = \sim 1.5$ Tesla, fat magnetization 12 precesses by rotating approximately 180° about the z-axis such that water magnetization 11 and fat magnetization 12 are approximately 180° out of phase as illustrated in FIG. 1C. A second RF pulse in the 1-(-1) sequence tips both water magnetization 11 and fat magnetization 12 by approximately $-45°$, restoring water magnetization 11 to the z-axis while tipping fat magnetization 12 into the detection plane as illustrated in FIG. 1D. Fat magnetization 12 is then spoiled by a magnetic field gradient pulse as illustrated in FIG. 1E, and water magnetization 11 may then be tipped from the z-axis into the detection plane by a selective RF pulse.

Adding more RF pulses in a binomial sequence helps improve the spectral width of the saturation in an inhomogeneous magnetic field. At $B_0 = \sim 1.5$ Tesla, a binomial 1-3-3-1 RF pulse sequence, for example, may be used for fat suppression.

Applying binomial sets of RF pulses in relatively lower magnetic fields, however, incurs relatively longer repetition times TR and therefore scan times as the duration of each interpulse interval is inversely proportional to the strength of the magnetic field $B_0$. At $B_0 = \sim 0.2$ Tesla, for example, a binomial RF pulse sequence requires an approximately 16.8 ms interpulse interval as compared to the approximately 2.2 ms interpulse interval required at $B_0 = \sim 1.5$ Tesla. For longer pulse sequences that are required for adequate suppression in an inhomogeneous magnetic field, the time penalty incurred is too great for many imaging applications. A binomial 1-3-3-1 RF pulse sequence, for example, requires approximately 50 ms in total interpulse interval time at $B_0 = \sim 0.2$ Tesla.

Also, the effectiveness of binomial RF pulse sequences in suppressing fat may be compromised in relatively lower magnetic fields as the relatively longer interpulse intervals together with the reduced relaxation time T1 for fat in the lower magnetic field allow significant fat magnetization regrowth. Relatively longer interpulse intervals also allow greater water magnetization decay as determined by the relaxation time T2 for water.

Another common fat suppression method relies upon the regrowth of fat magnetization. Fat and water magnetization regrow at different rates as determined by their respective relaxation times T1. Following application of an inverting RF pulse, regrown magnetization will effectively cancel the inverted magnetization after a certain time period TI=ln(2)*T1=~0.693*T1.

The application of a prior art inversion recovery RF pulse sequence for fat suppression is illustrated in graph form in FIGS. 2A, 2B, and 2C. As illustrated in FIG. 2A, water magnetization 21 and fat magnetization 22 are initially aligned with the static magnetic field $B_0$ along the z-axis at equilibrium. An inverting RF pulse tips both water magnetization 21 and fat magnetization 22 by approximately 180° as illustrated in FIG. 2B. After TI=~160 ms at $B_0$=~1.5 Tesla or TI=~110 ms at $B_0$=~0.2 Tesla, fat magnetization regrowth 23 effectively cancels inverted fat magnetization 22 as illustrated in FIG. 2C. Water magnetization 21 may then be tipped into the detection plane by a selective RF pulse.

At TI=~110 ms or ~160 ms, the time required for fat magnetization regrowth incurs relatively longer repetition times TR and therefore scan times. Inversion methods for fat suppression may also suppress the magnetization from tissues having a relaxation time T1 comparable to that of fat and alter the contrast between tissues from that normally achieved independently from the spin-echo or gradient-echo portion of the scan.

SUMMARY OF THE INVENTION

In accordance with the present invention, a method determines a radio frequency (RF) pulse sequence of N RE pulses and N−1 interpulse interval(s) for use in magnetic resonance imaging (MRI) of at least a portion of a subject comprising two chemical species, such as water and fat for example, having a chemical shift difference in resonant frequency. The number N of RF pulses is an integer greater than one and may be greater than or equal to three, for example.

For the method, a numerical optimization is performed to determine an amplitude and phase angle for each of the N RF pulses and a duration for each of the N−1 interpulse interval(s) so as to excite magnetization of a selective one of the two chemical species for MRI detection upon application of the RF pulse sequence to at least a portion of the subject.

A total duration of the RF pulse sequence may be constrained in performing the optimization. The optimization may be performed so as to help minimize magnetization of the selective one of the two chemical species along a predetermined axis and help maximize magnetization of the other one of the two chemical species along the predetermined axis upon application of the RF pulse sequence to at least a portion of the subject while constraining the total duration of the RF pulse sequence.

The optimization may also be performed so as to help minimize a total duration of the RF pulse sequence while constraining magnetization excitation of the selective one of the two chemical species for MRI detection upon application of the RF pulse sequence to at least a portion of the subject. The optimization may be performed so as to help minimize total interpulse interval time while constraining magnetization excitation of the selective one of the two chemical species for MRI detection upon application of the RF pulse sequence to at least a portion of the subject. Magnetization of each of the two chemical species along a predetermined axis may be constrained in performing the optimization.

The optimization may further constrain total interpulse interval time, the duration of each interpulse interval, the phase angle for each RF pulse, and/or a magnetization tip angle to be effectuated by each RF pulse upon application to at least a portion of the subject.

The determined RF pulse sequence may be applied to at least a portion of the subject, and an image may be reconstructed from resulting RF magnetic resonance (MR) signals detected from at least a portion of the subject.

Also in accordance with the present invention, a magnetic resonance imaging (MRI) system comprises a static magnet, pulse sequence apparatus, pulse sequence control apparatus, and a computer system.

The static magnet produces a magnetic field along a predetermined axis relative to at least a portion of the subject in an examination region. The magnetic field may be approximately 0.2 Tesla, for example. The pulse sequence apparatus creates magnetic field gradients in the examination region, applies radio frequency (RF) pulsed magnetic fields in the examination region, and receives RF magnetic resonance (MR) signals from the examination region. The pulse sequence control apparatus controls the pulse sequence apparatus to apply an RF pulse sequence in the examination region so as to excite magnetization of a selective one of the two chemical species. The RF pulse sequence is determined in accordance with the numerical optimization which may be performed by the computer system. The computer system reconstructs an image from received RF MR signals resulting from application of the RF pulse sequence in the examination region.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A magnetic resonance imaging (MRI) system performs optimized chemical-shift excitation. A computer system performs a numerical optimization for the MRI system to determine a set of parameters including radio frequency (RF) pulse amplitudes or strengths, RF pulse phase angles, and interpulse intervals for a binomial-like RF pulse sequence of N RF pulses that will excite a desired nuclear or chemical species, such as water for example. By allowing the RF pulse tip angles, RF pulse phase angles, and interpulse intervals to vary, the computer system may determine a binomial-like RF pulse sequence that requires relatively less time and that may therefore be used by the MRI system for applications at relatively lower magnetic fields, such as at $B_0=~0.2$ Tesla for example. The optimization performed by the computer system may constrain and/or help minimize the total interpulse interval time to ensure the resulting binomial-like RF pulse sequence requires relatively less time and to help minimize T1 and/or T2 relaxation.

Exemplary Magnetic Resonance Imaging (MRI) System

Figure 3:
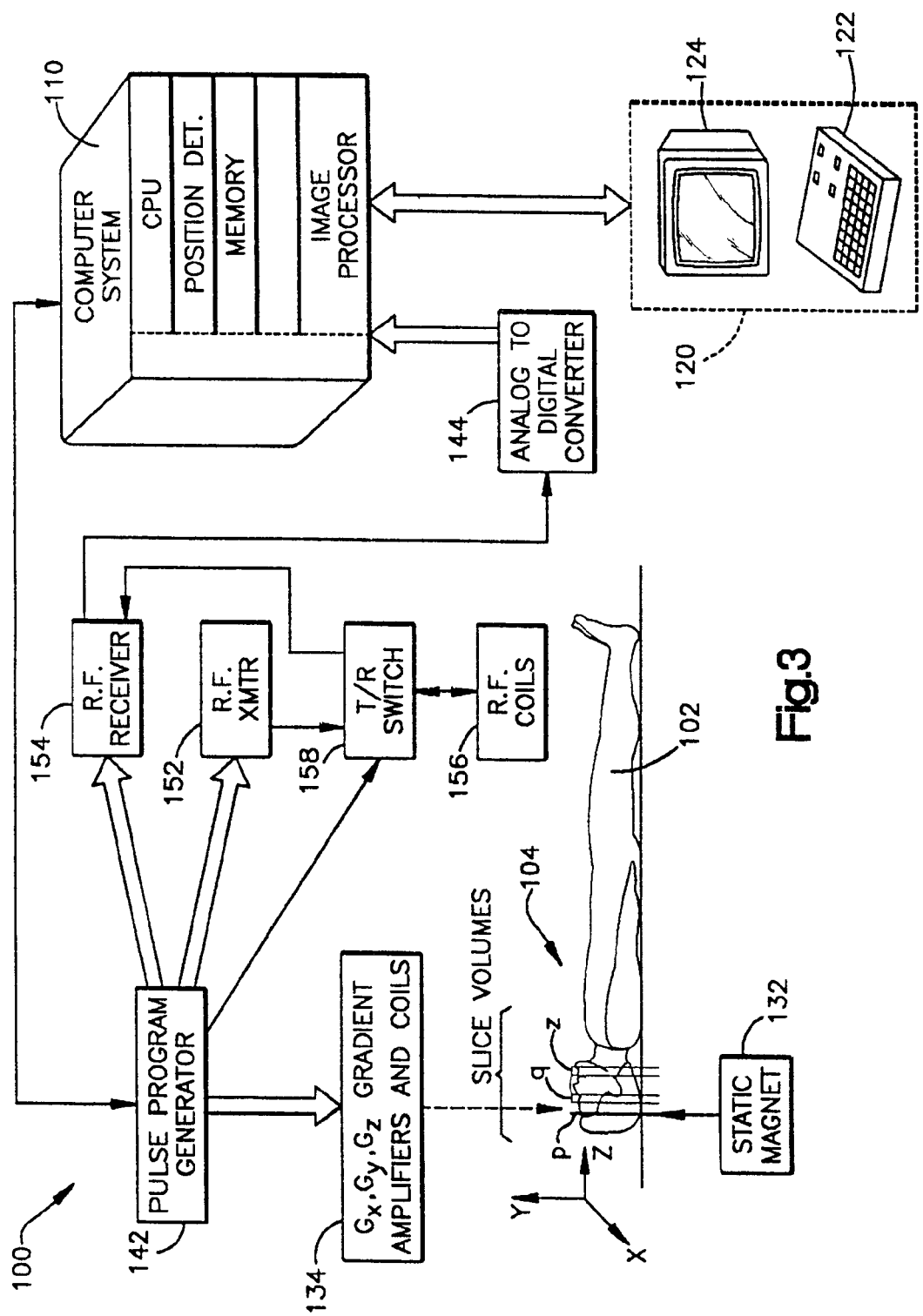
FIG. 3 illustrates in block diagram form an exemplary magnetic resonance imaging (MRI) system for performing optimized chemical-shift excitation in accordance with the present invention.

FIG. 3 illustrates an exemplary magnetic resonance imaging (MRI) system 100 for performing optimized chemical-shift excitation in accordance with the present invention.

The operation of MRI system 100 is controlled by a computer system 110. A console 120 comprising a control panel 122 and a display 124 communicates with computer system 110 to enable an operator to control the production and display of MRI images on display 124.

To produce images with MRI system 100, at least a portion of a subject 102 of interest is placed within an examination region 104. A static magnet 132 produces a substantially uniform, temporally constant magnetic field along a desired z-axis such that selected nuclear magnetic dipoles of subject 102 within examination region 104 preferentially align with the magnetic field. Although illustrated as a human subject, subject 102 may be an animal subject or any other suitable sample.

Computer system 110 communicates with a pulse program generator 142 to control a set of $G_x$, $G_y$, $G_z$ gradient amplifiers and coils 134, a radio frequency (RF) transmitter 152, and an RF receiver 154 so as to carry out a desired MRI scan sequence.

RF transmitter 152 transmits RF pulses into examination region 104 using RF coils 156 to cause magnetic resonance of the preferentially aligned dipoles of subject 102 within examination region 104. RF receiver 154 receives RF magnetic resonance (MR) signals detected by RF coils 156 from the resonating dipoles of examination region 104. Pulse program generator 142 also controls a transmit/receive (T/R) switch 158 selectively connecting RF transmitter 152 and RF receiver 154 to RF coils 156. Separate transmit and receive RF coils may also be used, obviating any need for T/R switch 158. Computer system 110 comprises an analog-to-digital converter 144 to receive the RF MR signals from RF receiver 154 in digital form and processes the digitized RF MR signals to reconstruct an image representation for display on display 124.

Gradient amplifiers and coils 134 impose time-varying magnetic field gradients with the static magnetic field along mutually orthogonal x, y, z-axes to spatially encode the received RF MR signals. In this manner, images may be scanned along a particular one of contiguous parallel slice-volumes p, q, . . . , z defined in examination region 104.

Computer system 110 loads software or program code defining different MRI pulse sequences into writable control storage areas of pulse program generator 142. Pulse program generator 142 executes program code corresponding to a given pulse sequence to provide suitable signals that control the operation of RF transmitter 152, RF receiver 154, T/R switch 158, and gradient amplifiers and coils 134 and thereby effectuate the given pulse sequence. Computer system 110 can specify and effectuate any suitable MRI pulse sequence for MRI system 100 as desired.

Optimized Hybrid Binomial RF Pulse Scheme

In accordance with the present invention, computer system 110 performs a numerical optimization to determine a set of parameters including RF pulse amplitudes or strengths, RF pulse phase angles, and interpulse intervals for a binomial-like RF pulse sequence of N RF pulses that will excite a desired chemical species, such as water for example, of at least a portion of subject 102. The number N of RF pulses is an integer greater than one and may be two, three, or four, for example. Although described as determining binomial-like RF pulse sequences for selective fat/water excitation, the present invention may be used for selective excitation of any other suitable chemical species having a chemical shift difference in resonance frequency.

The numerical optimization problem for one embodiment is formulated as the product of a series of rotation/transformation matrices.

The xyz magnetization for water and fat of subject 102 is described as:

$$M = \begin{vmatrix} M_x^{water} \\ M_y^{water} \\ M_z^{water} \\ M_x^{fat} \\ M_y^{fat} \\ M_z^{fat} \end{vmatrix} \quad \text{Equation 1}$$

where $M_x$, $M_y$, and $M_z$ represent magnetization along the x, y, and z axes, respectively.

A RF pulse rotation matrix is described as:

$$R(\alpha_n) = \begin{vmatrix} 1 & 0 & 0 & 0 & 0 & 0 \\ 0 & \cos(\alpha_n) & \sin(\alpha_n) & 0 & 0 & 0 \\ 0 & -\sin(\alpha_n) & \cos(\alpha_n) & 0 & 0 & 0 \\ 0 & 0 & 0 & 1 & 0 & 0 \\ 0 & 0 & 0 & 0 & \cos(\alpha_n) & \sin(\alpha_n) \\ 0 & 0 & 0 & 0 & -\sin(\alpha_n) & \cos(\alpha_n) \end{vmatrix} \quad \text{Equation 2}$$

where $\alpha_n$ is the angle at which the nth RF pulse of the binomial-like RF pulse sequence is to tip the water and fat magnetization.

The precession of the water and fat magnetization during an interpulse interval, presuming that fat precesses at a negative angular frequency relative to water, is described as:

$$P(\tau_n) = \begin{vmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & \cos(k\tau_n) & \sin(k\tau_n) & 0 \\ 0 & 0 & 0 & -\sin(k\tau_n) & \cos(k\tau_n) & 0 \\ 0 & 0 & 0 & 0 & 0 & 1 \end{vmatrix} \quad \text{Equation 3}$$

where $\tau_n$ is the duration of the nth interpulse interval of the binomial-like RF pulse sequence and k is a constant that relates interpulse interval time to a dephasing angle between fat and water.

The transformation of transverse magnetization from the conventional rotating reference frame coordinate system (x',y') to one aligned with an upcoming RF pulse is described as:

$$\Phi_n(\varphi_n) = \begin{vmatrix} \cos(\varphi_n) & \sin(\varphi_n) & 0 & 0 & 0 & 0 \\ -\sin(\varphi_n) & \cos(\varphi_n) & 0 & 0 & 0 & 0 \\ 0 & 0 & 1 & 0 & 0 & 0 \\ 0 & 0 & 0 & \cos(\varphi_n) & \sin(\varphi_n) & 0 \\ 0 & 0 & 0 & -\sin(\varphi_n) & \cos(\varphi_n) & 0 \\ 0 & 0 & 0 & 0 & 0 & 1 \end{vmatrix} \quad \text{Equation 4}$$

where $\psi_n$ is the phase angle of the nth RF pulse of the binomial-like RF pulse sequence.

That is, $\Phi$ is a rotation matrix used to express the current $M_{xy}$ in terms of components parallel and perpendicular to the phase modulated RF pulse. For one embodiment, the first RF pulse phase angle $\psi_1$ is set to 0° while the remaining phase angles $\psi_n$ for all subsequent RF pulses of the binomial-like RF pulse sequence are set relative to this first phase angle $\psi_1$.

The water and fat magnetization following the first RF pulse and first interpulse interval yet prior to the second RF pulse of the binomial-like RF pulse sequence is described as follows.

$$^+M(\alpha_1) = P(\tau_1)R(\alpha_1)M \quad \text{Equation 5}$$

The water and fat magnetization following the second RF pulse and second interpulse interval yet prior to the third RF pulse of the binomial-like RF pulse sequence is described as follows.

$$^+M(\alpha_2) = P(\tau_2)\cdot\Phi^{-1}(\psi_2)R(\alpha_2)\Phi(\psi_2)^+M(\alpha_1) \quad \text{Equation 6}$$

For each subsequent RF pulse and interpulse interval, the water and fat magnetization following the nth RF pulse and the nth interpulse interval yet prior to the (n+1)th RF pulse of the binomial-like RF pulse sequence is similarly described as follows.

$$^+M(\alpha_n) = P(\tau_n)\cdot\Phi^{-1}(\psi_n)R(\alpha_n)\Phi(\psi_n)^+M(\alpha_{n-1}) \quad \text{Equation 7}$$

For a binomial-like RF pulse sequence of N=3 RF pulses, the final water and fat magnetization is described as follows.

$$^+M(\alpha_3) = R(\alpha_3)\Phi(\psi_3)P(\tau_2)\Phi^{-1}(\psi_2)R(\alpha_2)\Phi(\psi_2)P(\tau_1)R(\alpha_1)M \quad \text{Equation 8}$$

In accordance with equations 1–8, computer system 110 determines an optimal or near-optimal set of RF pulse tip angles $\alpha_n$, interpulse intervals $\tau_n$, and RF pulse phase angles $\psi_n$ for a binomial-like RF pulse sequence of N RF pulses that will tip water magnetization into the detection plane and restore fat magnetization to the longitudinal axis. By allowing the RF pulse tip angles $\alpha_n$, interpulse intervals $\tau_n$, and RF pulse phase angles $\psi_n$ to vary, computer system 110 may determine a binomial-like RF pulse sequence that requires relatively less time and that may therefore be used by MRI system 100 for applications at relatively lower magnetic fields, such as at $B_0 = \sim 0.2$ Tesla for example.

Computer system 110 for one embodiment attempts to minimize the water magnetization $M_z^{water}$ along the z-axis and maximize the fat magnetization $M_z^{fat}$ along the z-axis in determining the set of parameters for a binomial-like RF pulse sequence of N RF pulses. As one example, computer system 110 attempts to minimize the function f as follows:

$$\min f = (^+M_z^{water}(\alpha_N))^2 + (1 - ^+M_z^{fat}(\alpha_N))^2 = \min f = M(3,1)^2 + (1 - M(6,1))^2 \text{ after the Nth pulse} \quad \text{Equation 9}$$

in determining the set of parameters. The function f is the squared deviation from the condition when the water magnetization along the z-axis is zero, indicating all water magnetization is in the transverse plane, and when the fat magnetization along the z-axis is one, indicating all fat magnetization is restored along the z-axis.

The optimization performed by computer system 110 for one embodiment constrains the total sequence time in determining the set of parameters to ensure the resulting binomial-like RF pulse sequence requires relatively less time. The total sequence time may be constrained, for example, by constraining the duration of each interpulse interval within a predetermined time range and the total interpulse interval time within a predetermined time range as follows.

$C1: \tau_{min} \leq \tau_n \leq \tau_{max}$ for $1 \leq n \leq N-1$ $C2: TT_{min} \leq \Sigma\tau_n \leq TT_{max}$ for $1 \leq n \leq N-1$ Under constraint C1, the minimum allowable interpulse interval $\tau_n$ for a binomial-like RF pulse sequence is $\tau_{min}$, and the maximum allowable interpulse interval $\tau_n$ for a binomial-like RF pulse sequence is $\tau_{max}$. The minimum and maximum interpulse interval times $\tau_{min}$ and $\tau_{max}$ may be set to any suitable value. As one example where each interpulse interval $\tau_n$ is measured from the centers of the nth and (n+1)th RF pulses, the minimum interpulse interval $\tau_{min}$ may be set to the RF pulse duration T which may have suitable value, such as 1.28 ms for N=3 for example, and the maximum interpulse interval $\tau_{max}$ may be set to $\infty$.

Under constraint C2, the minimum allowable total interpulse interval time $\Sigma\tau_n$ for a binomial-like RF pulse sequence is $TT_{min}$, and the maximum allowable total interpulse interval time $\Sigma\tau_n$ for a binomial-like RF pulse sequence is $TT_{max}$. The minimum and maximum total interpulse interval times $TT_{min}$ and $TT_{max}$ may be set to any suitable value. As one example where each interpulse interval $\tau_n$ is measured from the centers of the nth and (n+1)th RF pulses, the minimum total interpulse interval time $TT_{max}$ may be set to $(N-1)*T$, and the maximum total interpulse interval time $TT_{max}$ may be set to any suitable greater value. The maximum total interpulse interval time $TT_{max}$ may be set by an operator of MRI system 100 so as to reflect the maximum tolerable repetition time TR for a particular MRI application. As one example for N=3, $TT_{max}$ may be set to 20 ms. The maximum total interpulse interval time $TT_{max}$ may be set such that $\Sigma\tau_n$ is less than the duration of the interpulse interval for a single dephasing in typical binomial methods, or $k*\Sigma\tau_n < 180°$. By constraining the total interpulse interval time $\Sigma\tau_n$ the optimization performed by computer system 110 helps to minimize T1 and/or T2 relaxation and therefore helps alleviate concerns of fat magnetization regrowth and/or signal loss during each interpulse interval.

The optimization performed by computer system 110 may also constrain the values for the RF pulse tip angles $\alpha_n$ and RF pulse phase angles $\psi_n$ as follows.

$C3: \alpha_{min} \leq \alpha_n \leq \alpha_{max}$ for $1 \leq n \leq N$ $C4: \psi_{min} \leq \psi_n \leq \psi_{max}$ for $1 \leq n \leq N$ Under constraint C3, the minimum allowable RF pulse tip angle $\alpha_n$ is $\alpha_{min}$, and the maximum allowable RF pulse tip angle $\alpha_n$ is $\alpha_{max}$. The minimum and maximum RF pulse tip angles $\alpha_{min}$ and $\alpha_{max}$ may be set to any suitable value. Under constraint C4, the minimum allowable RF pulse phase angle $\psi_n$ is $\psi_{min}$, and the maximum allowable RF pulse phase angle $\psi_n$ is $\psi_{max}$. The minimum and maximum RF pulse phase angles $\psi_{min}$ and $\psi_{max}$ may be set to any suitable value. As one example, the minimum RF pulse tip angle $\alpha_{min}$ may be set to 0°, the maximum RF pulse tip angle $\alpha_{max}$ may be set to 180°, the minimum RF pulse phase angle $\psi_{min}$ may be set to −180°, and the maximum RF pulse phase angle $\psi_{max}$ may be set to 180° so that the RF pulses for a binomial-like RF pulse sequence may perform any possible rotation of the water and fat magnetization.

Computer system 110 for another embodiment attempts to minimize the total interpulse interval times as follows:

$$\min \sum_{n=1}^{N-1} \tau_n \qquad \text{Equation 10}$$

in determining the set of parameters for a binomial-like RF pulse sequence of N RF pulses. This optimization performed by computer system 110 may constrain the final water magnetization $M_z^{water}$ along the z-axis to a value less than or equal to a predetermined amount K1 and/or the final fat magnetization $M_z^{fat}$ along the z-axis to a value greater than or equal to a predetermined amount K2 as follows.

$$C5: {}^+M_z^{water}(\alpha_N) \leq K1$$

$$C6: {}^+M_z^{fat}(\alpha_N) \leq K2$$

K1 and K2 may each have any suitable value. For one embodiment where the maximum water magnetization $M_z^{water}$ along the z-axis and the maximum fat magnetization $M_z^{fat}$ along the z-axis are each normalized to 1.0 for simplicity, K1 may be approximately 0.05, for example, and K2 may be approximately 0.95, for example. Computer system 110 may attempt to minimize the total interpulse interval time in this manner to better ensure minimal T1 and/or T2 relaxation.

In addition to constraints C5 and C6, computer system 110 may use one or more of the constraints C1–C4 in attempting to minimize the total interpulse interval time for a binomial-like RF pulse sequence.

Computer system 110 may perform the optimizations for equations 9 and 10 and constraints C1–C6 using any suitable nonlinearly constrained optimization algorithm. Computer system 110 for one embodiment may use the nonlinearly constrained optimization algorithm in the Optimization Toolbox of the Matlab 5.2 programming environment provided by The Mathworks of Nattick, Mass.

Once the set of parameters for a binomial-like RF pulse sequence have been determined, computer system 110 may then control MRI system 100 to apply the binomial-like RF pulse sequence to subject 102. Computer system 110 may load suitable program code defining the binomial-like RF pulse sequence into pulse program generator 142. Pulse program generator 142 may then execute the program code to thereby effectuate the binomial-like RF pulse sequence.

Although described as being determined by computer system 110, any suitable computer system, such as a personal computer for example, may be used to determine the set of parameters for a binomial-like RF pulse sequence. The determined set of parameters may then be programmed or entered into computer system 110 in a suitable manner using console 120, for example.

Figure 4C:
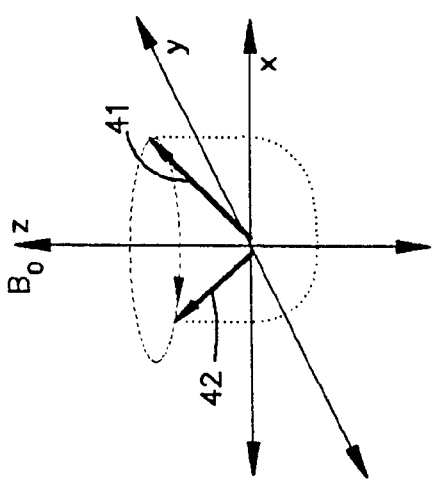
FIGS. 4A, 4B, 4C, 4D, 4E, and 4F illustrate in graph form water and fat magnetization subjected to an exemplary binomial-like RF pulse sequence for water excitation in accordance with the present invention.
Figure 4F:
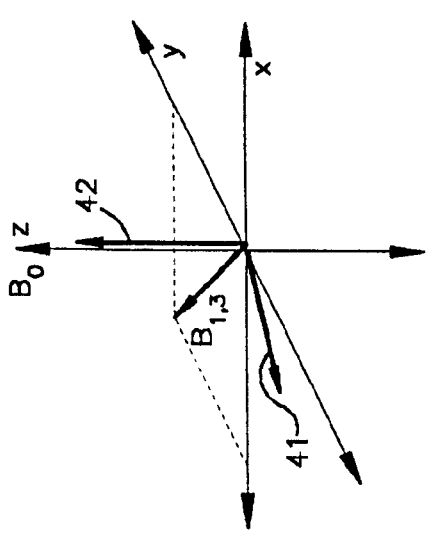
Figure 4B:
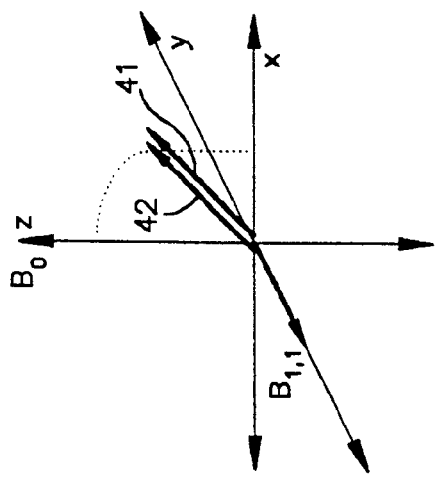
Figure 4E:
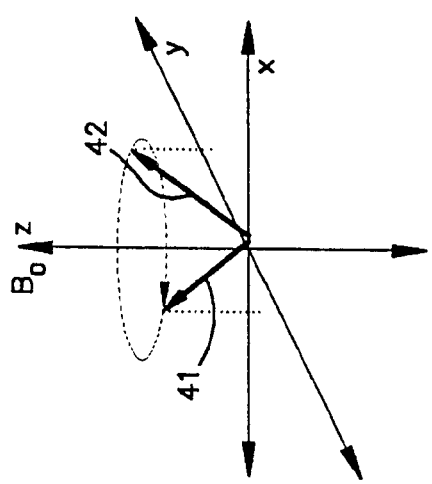
Figure 4A:
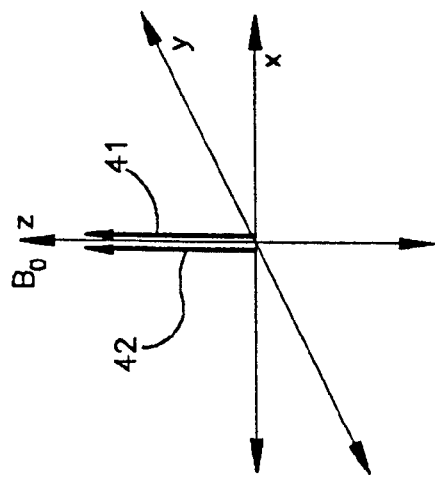
Figure 4D:
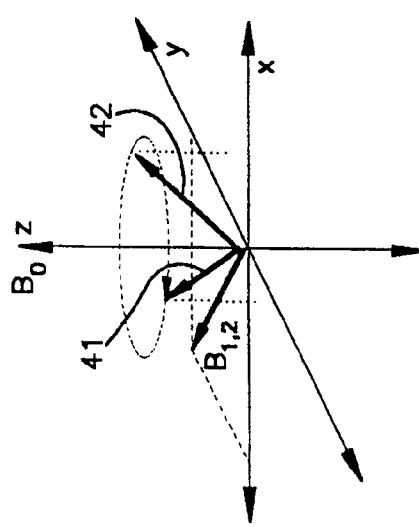

The application of an exemplary binomial-like RF pulse sequence of N=3 pulses as determined by computer system 110 is illustrated in graph form in FIGS. 4A, 4B, 4C, 4D, 4E, and 4F. As illustrated in FIG. 4A, water magnetization 41 and fat magnetization 42 are initially aligned with the static magnetic field $B_0$ along the z-axis at equilibrium. The first RF pulse, characterized by a tip angle of $\alpha_1°$ and a phase angle of $\psi_1=0°$, tips both water magnetization 41 and fat magnetization 42 by $\alpha_1°$ as illustrated in FIG. 4B. During the first interpulse interval $\tau_1$, fat magnetization 42 precesses by rotating $(k*\tau_1)°$ about the z-axis such that water magnetization 41 and fat magnetization 42 are $(k*\tau_1)°$ out of phase as illustrated in FIG. 4C. The second RF pulse, characterized by a tip angle of $\alpha_2°$ and a phase angle of $\psi_2°$, tips both water magnetization 41 and fat magnetization 42 by $\alpha_2°$ as illustrated in FIG. 4D. During the second interpulse interval $\tau_2$, water magnetization 41 and fat magnetization 42 precess $(k*\tau_2)°$ out of phase from their relative position following the second RF pulse, as illustrated in FIG. 4E. The third RF pulse, characterized by a tip angle of $\alpha_3°$ and a phase angle of $\psi_3°$, tips both water magnetization 41 and fat magnetization 42 by $\alpha_3°$ such that water magnetization 41 is tipped into the detection plane and fat magnetization 42 is restored to the z-axis as illustrated in FIG. 4F.

MRI system 100 may apply binomial-like RF pulse sequences at any suitable magnetic field $B_0$. As a binomial-like RF pulse sequence may be determined so as to require relatively less time with minimal T1 and/or T2 relaxation as compared to typical binomial or inversion recovery sequences, MRI system 100 may apply binomial-like RF pulse sequences at relatively lower magnetic fields, such as at $B_0=\sim 0.2$ Tesla for example, to enhance the conspicuity of lesions that occur in or near fat in imaging the orbits, skull base, or appendicular areas, for example. To accommodate water excitation in a pulse sequence and therefore the increased repetition time TR, MRI system 100 may allow the scan TR and hence scan time to increase or may reduce the number of slices in examination region 104 in interleaved multi-slice experiments while maintaining TR substantially constant.

Although described in connection with MRI system 100 as illustrated in FIG. 3, any suitable MRI system may be used. One suitable MRI system is a Siemens Magnetom Opens® 0.2T resistive imager, manufactured by Siemens Medical Systems of Erlangen, Germany, with Numaris V3.5.1 software, a 26 ms/500 ms spin-echo sequence, and a FLASH 9 ms/45 ms (TRITE).

Figure 1A:
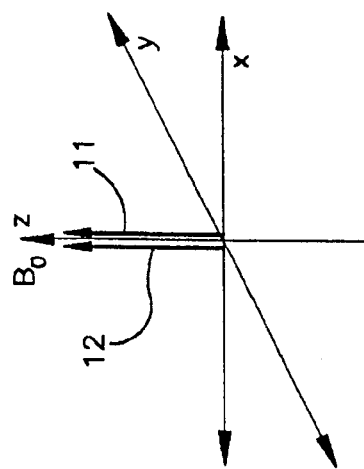
FIGS. 1A, 1B, 1C, 1D, and 1E illustrate in graph form water and fat magnetization subjected to a prior art binomial 1-(-1) RF pulse sequence for fat suppression.
Figure 1B:
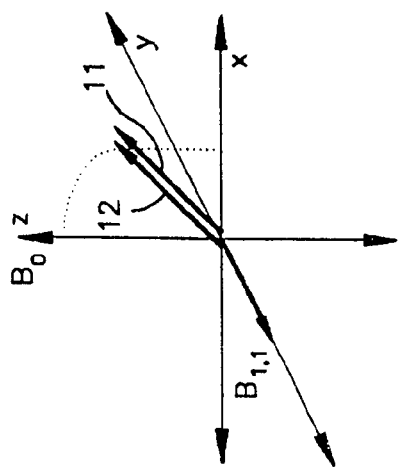
Figure 1C:
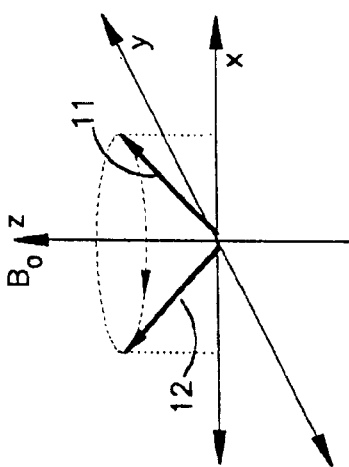
Figure 1D:
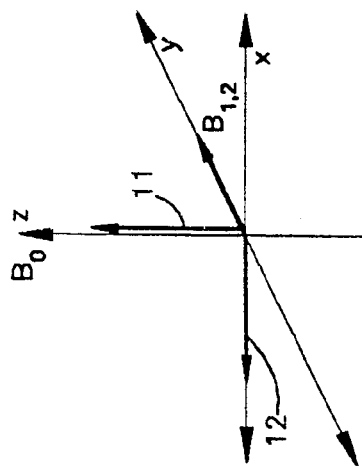
Figure 1E:
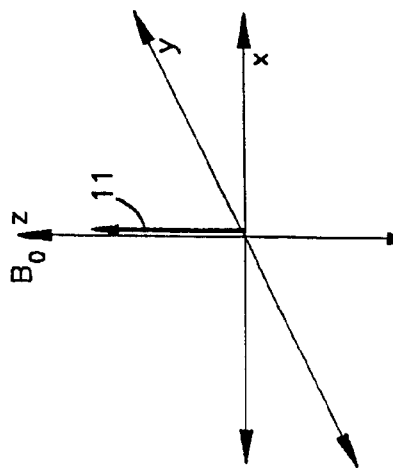
Figure 2A:
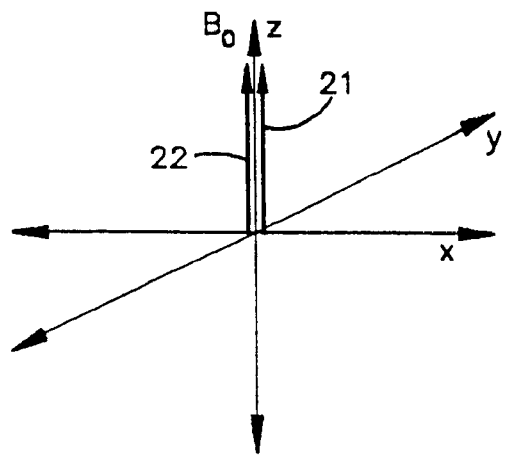
FIGS. 2A, 2B, and 2C illustrate in graph form water and fat magnetization subjected to a prior art inversion recovery RF pulse sequence for fat suppression.
Figure 2B:
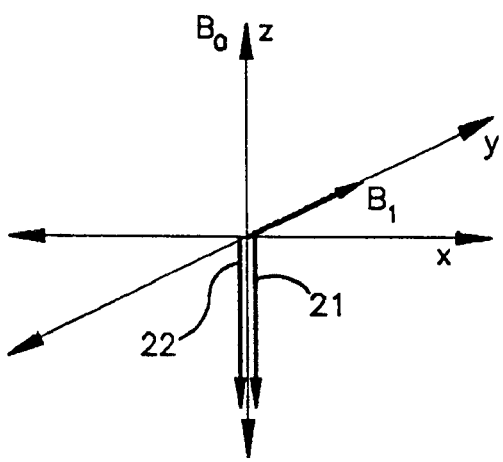
Figure 2C:
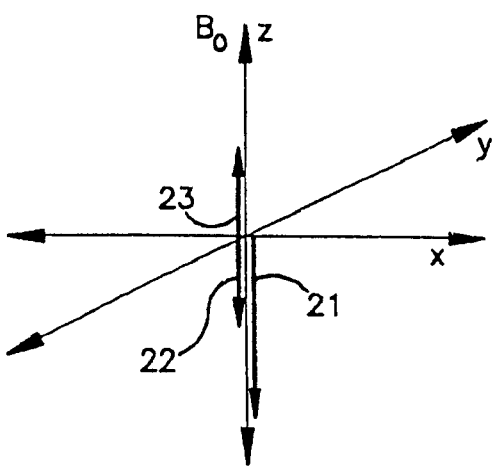

In addition to water excitation, computer system 110 may also determine binomial-like RF pulse sequences to suppress fat magnetization. Computer system 110 may similarly determine the set of parameters for a binomial-like RF pulse sequence that will tip fat magnetization into the detection plane and restore water magnetization to the longitudinal axis so that the fat magnetization may be spoiled as described in connection with FIG. 1E. The water magnetization may then be tipped into the detection plane by a selective RF pulse.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A computer-implemented method for determining a radio frequency (RF) pulse sequence of N RF pulses and N−1 interpulse interval(s), where N is an integer greater than one, for use in magnetic resonance imaging (MRI) of at least a portion of a subject comprising two chemical species having a chemical shift difference in resonant frequency, the method comprising the step of:

performing a numerical optimization to determine an amplitude and phase angle for each of the N RF pulses and a duration for each of the N−1 interpulse interval(s) so as to excite magnetization of a selective one of the two chemical species for MRI detection upon application of the RF pulse sequence to at least a portion of the subject.

2. The method of claim 1, where N is an integer greater than or equal to three.

3. The method of claim 1, wherein the performing step comprises the step of constraining total interpulse interval time and/or the duration of each interpulse interval.

4. The method of claim 1, wherein the performing step comprises the step of constraining the phase angle for each RF pulse and/or a magnetization tip angle to be effectuated by each RF pulse upon application to at least a portion of the subject.

5. The method of claim 1, in combination with the additional steps of:
   applying the determined RF pulse sequence to at least a portion of the subject; and
   reconstructing an image from resulting RF magnetic resonance signals detected from at least a portion of the subject.

6. The method of claim 1, wherein the two chemical species are water and fat.

7. A computer-implemented method for determining a radio frequency (RF) pulse sequence of N RF pulses and N−1 interpulse interval(s), where N is an integer greater than one, for use in magnetic resonance imaging (MRI) of at least a portion of a subject comprising two chemical species having a chemical shift difference in resonant frequency, the method comprising the step of:
   performing a constrained numerical optimization to determine an amplitude and phase angle for each of the N RF pulses and a duration for each of the N−1 interpulse interval(s) so as to excite magnetization of a selective one of the two chemical species for MRI detection upon application of the RF pulse sequence to at least a portion of the subject while constraining a total duration of the RF pulse sequence.

8. The method of claim 7, wherein the performing step comprises the step of performing the constrained numerical optimization so as to help minimize magnetization of the selective one of the two chemical species along a predetermined axis and help maximize magnetization of the other one of the two chemical species along the predetermined axis upon application of the RF pulse sequence to at least a portion of the subject while constraining the total duration of the RF pulse sequence.

9. The method of claim 7, wherein the performing step comprises the step of constraining total interpulse interval time and/or the duration of each interpulse interval.

10. The method of claim 7, wherein the performing step comprises the step of constraining the phase angle for each RF pulse and/or a magnetization tip angle to be effectuated by each RF pulse upon application to at least a portion of the subject.

11. The method of claim 7, in combination with the additional steps of:
   applying the determined RF pulse sequence to at least a portion of the subject; and
   reconstructing an image from resulting RF magnetic resonance signals detected from at least a portion of the subject.

12. The method of claim 7, wherein the two chemical species are water and fat.

13. A computer-implemented method for determining a radio frequency (RF) pulse sequence of N RF pulses and N−1 interpulse interval(s), where N is an integer greater than one, for use in magnetic resonance imaging (MRI) of at least a portion of a subject comprising two chemical species having a chemical shift difference in resonant frequency, the method comprising the step of:
   performing a constrained numerical optimization to determine an amplitude and phase angle for each of the N RF pulses and a duration for each of the N−1 interpulse interval(s) so as to help minimize a total duration of the RF pulse sequence while constraining magnetization excitation of a selective one of the two chemical species for MRI detection upon application of the RF pulse sequence to at least a portion of the subject.

14. The method of claim 13, wherein the performing step comprises the step of performing the constrained numerical optimization so as to help minimize total interpulse interval time while constraining magnetization excitation of the selective one of the two chemical species for MRI detection upon application of the RF pulse sequence to at least a portion of the subject.

15. The method of claim 13, wherein the performing step comprises the step of constraining magnetization of each of the two chemical species along a predetermined axis.

16. The method of claim 13, wherein the performing step comprises the step of constraining total interpulse interval time and/or the duration of each interpulse interval.

17. The method of claim 13, wherein the performing step comprises the step of constraining the phase angle for each RF pulse and/or a magnetization tip angle to be effectuated by each RF pulse upon application to at least a portion of the subject.

18. The method of claim 13, in combination with the additional steps of:
   applying the determined RF pulse sequence to at least a portion of the subject; and
   reconstructing an image from resulting RF magnetic resonance signals detected from at least a portion of the subject.

19. The method of claim 13, wherein the two chemical species are water and fat.

20. A magnetic resonance imaging (MRI) system comprising:
   a static magnet for producing a magnetic field along a predetermined axis relative to at least a portion of a subject in an examination region, the subject comprising two chemical species having a chemical shift difference in resonant frequency;
   pulse sequence apparatus for creating magnetic field gradients in the examination region, for applying radio frequency (RF) pulsed magnetic fields in the examination region, and for receiving RF magnetic resonance (MR) signals from the examination region;
   pulse sequence control apparatus for controlling the pulse sequence apparatus to apply an RF pulse sequence in the examination region so as to excite magnetization of a selective one of the two chemical species, the RF pulse sequence having (i) N RF pulses each having an amplitude and phase angle determined in accordance with a numerical optimization and (ii) N−1 interpulse interval(s) each having a duration determined in accordance with the numerical optimization, where N is an integer greater than one; and
   a computer system for reconstructing an image from received RF MR signals resulting from application of the RF pulse sequence in the examination region.

21. The MRI system of claim 20, where N is an integer greater than or equal to three.

22. The MRI system of claim 20, wherein each RF pulse amplitude, each RF pulse phase angle, and each interpulse interval duration is determined in accordance with the numerical optimization such that a total duration of the RF pulse sequence is constrained.

23. The MRI system of claim 22, wherein each RF pulse amplitude, each RF pulse phase angle, and each interpulse interval duration is determined in accordance with the numerical optimization so as to help minimize magnetization of the selective one of the two chemical species along the predetermined axis and help maximize magnetization of the other one of the two chemical species along the predetermined axis.

24. The MRI system of claim 20, wherein each RF pulse amplitude, each RF pulse phase angle, and each interpulse interval duration is determined in accordance with the numerical optimization so as to help minimize a total duration of the RF pulse sequence.

25. The MRI system of claim 24, wherein each RF pulse amplitude, each RF pulse phase angle, and each interpulse interval duration is determined in accordance with the numerical optimization so as to help minimize total interpulse interval time.

26. The MRI system of claim 24, wherein each RF pulse amplitude, each RF pulse phase angle, and each interpulse interval duration is determined in accordance with the numerical optimization such that magnetization of the selective one of the two chemical species along the predetermined axis is less than a predetermined value and such that magnetization of the other one of the two chemical species along the predetermined axis is greater than a predetermined value.

27. The MRI system of claim 20, wherein each RF pulse amplitude, each RF pulse phase angle, and each interpulse interval duration is determined in accordance with the numerical optimization such that total interpulse interval time and/or each interpulse interval duration is constrained.

28. The MRI system of claim 20, wherein each RF pulse amplitude, each RF pulse phase angle, and each interpulse interval duration is determined in accordance with the numerical optimization such that each phase angle and/or a magnetization tip angle to be effectuated by each RF pulse is constrained.

29. The MRI system of claim 20, wherein the computer system performs the numerical optimization to determine each RF pulse amplitude, each RF pulse phase angle, and each interpulse interval duration.

30. The MRI system of claim 20, wherein the two chemical species are water and fat.

31. The MU system of claim 20, wherein the static magnet produces a magnetic field of approximately 0.2 Tesla.

* * * * *